United States Patent [19]

Niehaus

[11] Patent Number: 5,068,599

[45] Date of Patent: Nov. 26, 1991

[54] INTEGRATED CIRCUIT HAVING AN ENABLING CIRCUIT FOR CONTROLLING PRIMARY AND SECONDARY SUBCIRCUITS

[75] Inventor: Jeffrey A. Niehaus, Dallas, Tex.

[73] Assignee: Texas Instruments Incorporated, Dallas, Tex.

[21] Appl. No.: 425,787

[22] Filed: Oct. 23, 1989

[51] Int. Cl.[5] ............................................. G01R 31/02
[52] U.S. Cl. .............................. 324/158 R; 324/73.1; 324/158 T; 371/22.6
[58] Field of Search ........... 324/158 R, 158 D, 158 T, 324/73.1; 307/364, 570, 303.1.303; 371/1, 20.1, 25.1, 22.6; 437/8

[56]  References Cited

U.S. PATENT DOCUMENTS

| | | | |
|---|---|---|---|
| 4,138,614 | 2/1979 | Ochi | 307/570 |
| 4,490,673 | 12/1984 | Blum et al. | 324/158 R |
| 4,550,289 | 10/1985 | Kabashima et al. | 324/158 R |
| 4,695,750 | 9/1987 | Hara et al. | 307/570 |
| 4,720,671 | 1/1988 | Tada et al. | 324/158 R |
| 4,743,841 | 5/1988 | Takeuchi | 324/158 R |
| 4,782,283 | 11/1988 | Zasio | 324/158 R |
| 4,816,757 | 3/1989 | Hutchins | 324/158 R |

Primary Examiner—Kenneth A. Wieder
Assistant Examiner—Vinh P. Nguyen
Attorney, Agent, or Firm—B. Peter Barndt; James T. Comfort; Melvin Sharp

[57]  ABSTRACT

An integrated circuit (10) which includes primary circuit (12) and secondary circuit (17). An enabling circuit (16) allows package pins (15) to be shared between the primary circuit (12) and secondary circuit (17) responsive to voltages on the package pins (15). Enabling circuit (16) further includes disabling circuitry to disable the secondary circuit (17) responsive to a predetermined voltage on the $V_{cc}$ pin and enables the secondary circuit (17) responsive to a ground voltage on the $V_{cc}$ pin.

27 Claims, 1 Drawing Sheet

INTEGRATED CIRCUIT HAVING AN ENABLING CIRCUIT FOR CONTROLLING PRIMARY AND SECONDARY SUBCIRCUITS

TECHNICAL FIELD OF THE INVENTION

This invention relates in general to integrated circuits, and more particularly to an integrated circuit having primary and secondary subcircuits.

BACKGROUND OF THE INVENTION

In integrated circuit technology, it is often desirable to have two or more independent subcircuits for performing individual functions. However, it is desirable to limit the number of pins used on an integrated circuit device.

In prior art devices, multiplexers have been used to send a signal from one pin to one of two or more circuits. For example, in a memory chip, the same data pins are used for both read and write functions. However, this circuitry requires that a control signal be input to the integrated circuit, thereby necessitating an additional pin (e.g., the "R/W pin).

In some instances, it may be desirable to have a subcircuit which is not used during normal operation of the integrated circuit. For example, it may be desirable to provide a circuit which is capable of testing the operating characteristics of the overall integrated circuit. This subcircuit would only be used while the integrated circuit was not in an operating mode. Hence, any pin dedicated to the testing subcircuit would be overhead during the normal operation of the circuit. Therefore, a need has arisen in the industry for a method and apparatus for selectively enabling one of two or more subcircuits without the need for additional packages pins.

SUMMARY OF THE INVENTION

In accordance with the present invention, an integrated circuit having primary and secondary subcircuits is provided which substantially eliminates the problems associated with prior circuits.

The integrated circuit of the present invention includes primary and secondary subcircuits, each subcircuit connected to a first package pin. Enabling circuitry coupled to the package pin is operable to couple the first package pin to the primary subcircuit responsive to a first signal on the package pin and is operable to couple the first package pin to the secondary subcircuit responsive to a second signal on the first package pin.

This aspect of the present invention provides the technical advantage that a package pin may be coupled to either the primary or secondary subcircuit responsive to the signal on the package pin, thereby eliminating the need for additional package pins.

In a second aspect of the present invention, testing circuitry is connected to the first package pin. The testing circuitry includes two emitter followers of the same size. The collectors of the emitter followers are coupled to the first package pin and their emitters are coupled to additional second and third package pins. The bases of the emitter followers are coupled to the terminals of an active element across which it is desired to measure a voltage potential difference. This aspect of the present invention provides the technical advantage of allowing accurate measurements of a voltage potential through package pins used for another function.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
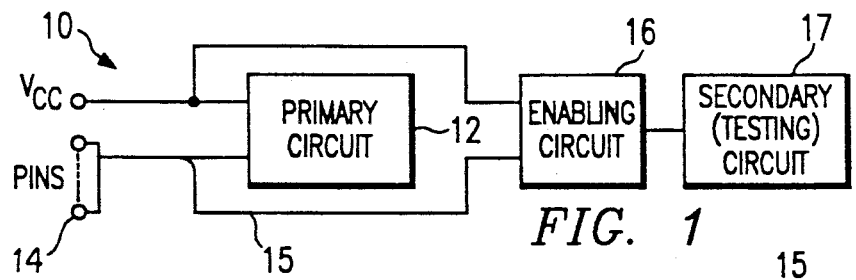
FIG. 1 illustrates a block representation of the present invention.
Figure 2:
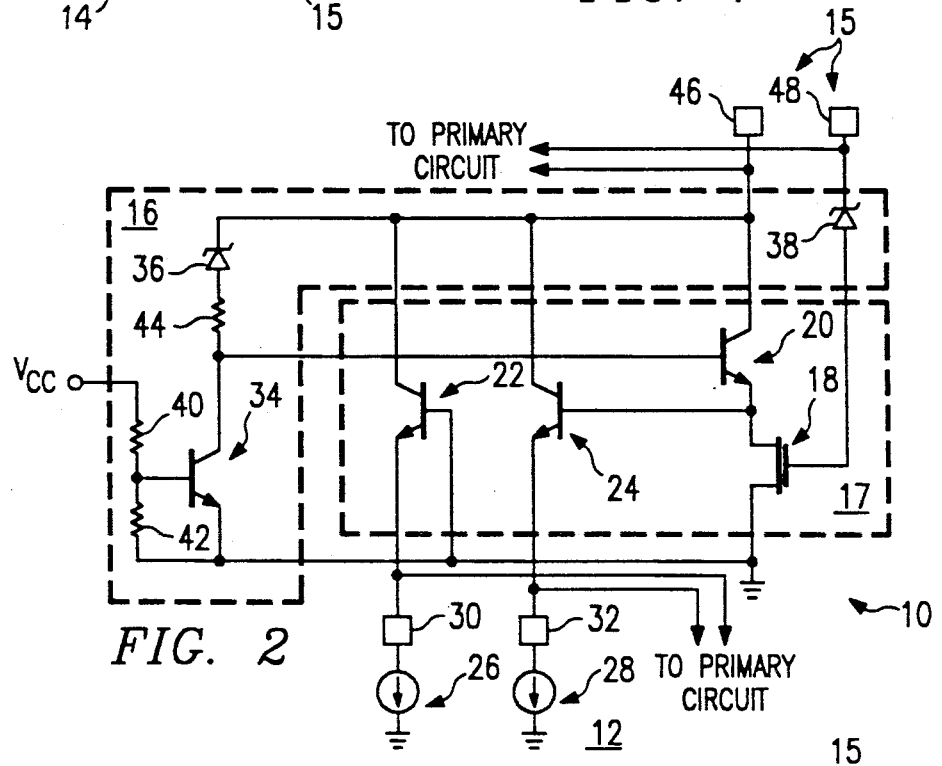
FIG. 2 illustrates a schematic representation of an embodiment of the present invention used to enable and disable an FET test circuit.
Figure 3:
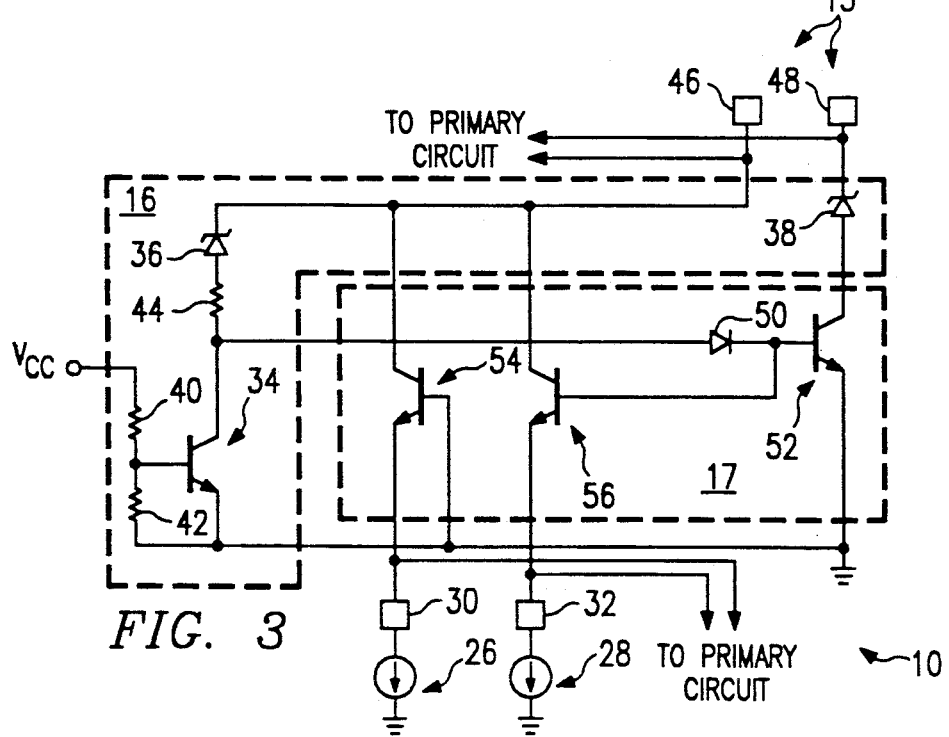
FIG. 3 illustrates a schematic representation of an embodiment of the present invention used to enable and disable a bipolar transistor test circuit.

The preferred embodiment of the present invention is best understood by referring to FIGS. 1-3 of the drawings, like numerals being used for like and corresponding parts of the various drawings.

FIG. 1 illustrates a block diagram of an integrated circuit of the current invention, generally referred to by reference numeral 10. A primary circuit is connected to the $V_{cc}$ pin (or other voltage supply rail) and to other package pins of the integrated circuit 10. Enabling circuit 16 is connected to $V_{cc}$ and to pins 15 which comprise one or more of the package pins 14. The enabling circuit 16 is connected to a secondary circuit 17.

In operation, the primary circuit 12 is typically enabled during normal operation of the integrated circuit 10. Responsive to a predetermined signal on the pins 15, the enabling circuit 16 couples the secondary circuit 17 with the pins 15.

In the preferred embodiment, the enabling circuit 16 will couple the secondary circuit 17 to the pins 15 only when the $V_{cc}$ pin is below one volt with respect to ground (for a bipolar circuit). When the $V_{cc}$ pin is below one volt, the primary circuit 12 will be disabled. Conversely, when the $V_{cc}$ pin is at five volts (the high side supply voltage) the enabling circuit will disable the secondary circuit 17 regardless of the signal on the pins 15.

FIG. 2 illustrates a schematic representation of an embodiment of the current invention where the operating characteristics of an FET can be measured in secondary circuit 17. Secondary circuit 17 comprises an element to be tested, illustrated as FET 18, and transistor 20 and two identical NPN transistors 22 and 24.

Two identical current sources 26 and 28 are external to the integrated circuit and coupled to transistors 22 and 24 through package pins 30 and 32.

Enabling circuit 16 comprises switching transistor 34, Zener diodes 36 and 38, resistors 40, 42 and 44. Package pins 46 and 48 are coupled to the enabling circuit 16 and to the primary circuit 12 (not shown).

One end of resistor 40 is coupled to the $V_{cc}$ pin and the other end is coupled to the base of switching transistor 34. Resistor 42 is coupled between the base of switching transistor 34 and ground. The emitter of switching transistor 34 is coupled to ground and the collector is coupled to one end of resistor 44. The other end of resistor 44 is coupled to the anode of diode 36; the cathode of diode 36 is coupled to package pin 46.

The base of transistor 20 is coupled to the collector of switching transistor 34, the collector of transistor 20 is coupled to package pin 46, and the emitter of transistor 20 is coupled to the base of transistor 24. The collector of transistor 24 is coupled to package pin 46 and the emitter of transistor 24 is coupled to current source 28 through package pin 32. The base of transistor 22 is coupled to ground, the collector of transistor 22 is coupled to package pin 46, and the emitter of transistor 22 is coupled to current source 26 through package pin 30. The drain of FET 18 is coupled to the emitter of transistor 20, the source is coupled to ground, and the gate is coupled to the anode of diode 38. The cathode of diode 38 is coupled to package pin 48.

In operation, the potential difference between the source and drain of FET 18 can be determined as follows. The $V_{cc}$ pin is brought below 1 volt with respect to ground, thereby disabling switching transistor 34. Voltages which exceed the Zener breakdown voltage of diodes 36 and 38 are applied to package pins 46 and 48 causing the diodes 36 and 38 to conduct. Typically, the breakdown voltage of the Zener diodes is set to a value above five volts, such that normal logic signals at the pins 46 and 48 will be insufficient to result in breakdown of the diodes. After the voltage on pin 48 exceeds the breakdown voltage of diode 38, the voltage at the gate of FET 18 may be varied by further increasing the voltage. Similarly, the voltage on the drain of FET 18 and the base of transistor 24 can be varied by raising the voltage on pin 46 above the breakdown voltage of diode 36. Two voltages may be read at package pins 30 and 32 and their difference represents the potential difference across the source and drain of FET 18. By varying the drain current through FET 18 and measuring $V_{DS}$, a curve can be plotted and the part (FET 18) screened by its characteristics. The transistors 22 and 24 allow accurate measurement of the voltage between the drain of FET 18 and ground (the source voltage). Since current sources 26 and 28 are set to conduct an equal current, the $V_{be}$ of transistors 22 and 24 will be equal. Use of equal sized transistors 22 and 24 ensures an equal $V_{be}$ irrespective of processing variations. By measuring the voltages at the emitters of transistors 22 and 24, an accurate measurement may be obtained. When the secondary circuit 17 is disabled, the package pins 30 and 32 may be used with the primary circuit 12.

An additional test which may be performed by the test circuit 17 is the breakdown voltage of the Zener diode. This test may be implemented by raising the voltage on the pins 46 and 48 until a current is detected.

After testing, when the primary circuit 12 is in normal service, the voltage at the $V_{cc}$ pin will be approximately five volts and the voltages at package pins 46 and 48 will be low enough to not cause a breakdown of Zener diodes 36 and 38. Consequently, switching transistor 34 will be on, shorting the collector to ground and allowing only a nominal amount of current to flow into the base of transistor 20. Consequently, the testing circuit 17 is effectively removed from the circuit and does not affect the normal operation of primary circuit 14.

FIG. 3 illustrates a schematic representation of a second aspect of the invention as used to measure the beta value of a transistor 50 in primary circuit 14. Enabling circuit 16 is essentially the same as illustrated in connection with FIG. 2.

The secondary circuit 17 comprises a diode 50 having its anode connected to the collector of transistor 34, and its cathode connected to the base of a NPN transistor 52. The collector of transistor 52 is connected to anode of Zener diode 38. The emitter of transistor 52 is connected to ground. Emitter follower transistors 54 and 56 have collectors connected to package pin 46 and emitters connected to package pins 30 and 32, respectively. The base of transistor 54 is connected to ground and the base of transistor 56 is connected to the base of transistor 52. As in FIG. 2, external current sources 26 and 28 are connected to package pins 30 and 32, respectively.

As described in connection with FIG. 2, the secondary circuit 17 is placed in operation when the $V_{cc}$ pin is brought below one volt and the voltages on package pins 46 and 48 are raised above the breakdown voltage of diodes 36 and 38. Emitter followers 54 and 56 allow accurate measurement of the base-emitter voltage of transistor 52. By varying the voltages on pins 46 and 48, the characteristics of transistor 50 may be determined.

During normal operation, when the primary circuit 12 is enabled, the $V_{cc}$ pin will be high, and the voltages on package pins 46 and 48 will be at normal logic levels. Hence, the secondary circuit 17 will be effectively disabled and will not interfere normal operation of the integrated circuit 10.

While the present invention has been described using an enabling circuit 16 which selectively couples two package pins 46 and 48 to the secondary circuit 17, the number of pins affected by the enabling circuit 16 may vary from a single pin to the total number of package pins on the integrated circuit (excluding $V_{cc}$ and ground). An example of a single pin enabling circuit is shown in U.S. patent application Ser. No. 07/423,275, filed Oct. 18, 1989 entitled "Voltage Switching Circuit for Logic Arrays" to Ovens, et al., filed contemporaneously herewith which is incorporated by reference herein. Furthermore, test circuits operable to determine the current, gain, potential and breakdown voltage of a device, among other device characteristics, may also be implemented using the present invention.

In the illustrated embodiment of the invention, Zener diodes are used to detect the voltage applied to one or more package pins. Similar voltage detecting circuits could also be employed, and the breakdown voltage of the voltage detecting circuit could be set as appropriate.

The present invention provides significant technical advantages over prior art integrated circuits. As described, package pins may be used for both the primary and secondary circuits without the need to dedicate one or more package pins for control purposes.

Although the present invention has been described in detail, it should be understood that various changes, substitutions and alterations can be made herein without departing from the spirit and scope of the invention as defined by the appended claims.

What is claimed is:

1. An integrated circuit including a primary circuit and a secondary circuit, said integrated circuit further comprising:
   (a) a first pin coupled to said integrated circuit; and
   (b) enabling circuitry coupled to said first pin, said enabling circuitry, coupling said first pin to said primary circuit responsive to a predetermined first signal on said first pin and coupling said first pin to said secondary circuit responsive to a second predetermined signal different from said predetermined first signal on said first pin.

2. The integrated circuit of claim 1, further including a voltage supply for supplying a voltage up to a normal high voltage, wherein said enabling circuitry couples said first pin to said primary circuit responsive to said voltage less than or equal to approximately the normal high supply voltage on said first pin.

3. The integrated circuit of claim 1, further including a voltage supply for providing a voltage up to a normal high voltage, wherein said enabling circuitry couples said first pin to the secondary circuit responsive to a voltage of greater than approximately said high supply voltage on said first pin.

4. The integrated circuit of claim 1 wherein said enabling circuitry includes a voltage level detector having a breakdown voltage, said first signal being a signal having a voltage of less than the breakdown voltage of said voltage level detector and said second signal being a signal having a voltage of greater than said breakdown voltage.

5. The integrated circuit of claim 4 wherein said voltage level detector comprises a Zener diode.

6. The integrated circuit of claim 1 and further comprising a second pin, said enabling circuitry also disabling a predetermined one of the primary and secondary circuits responsive to a predetermined signal on said second pin.

7. The integrated circuit of claim 6 wherein said integrated circuit further includes a high supply voltage node, said second pin being coupled to said high supply voltage node.

8. The integrated circuit of claim 7 wherein said enabling circuitry also disables said primary circuit when said second pin is brought lower than a predetermined voltage.

9. The integrated circuit of claim 8 wherein said enabling circuitry also disables said secondary circuit when said second pin is connected to a $V_{cc}$ voltage of at least 4.5 volts.

10. The integrated circuit of claim 9, further including a Zener diode having an anode, wherein said enabling circuitry also comprises a transistor having a base coupled through a resistor to said second pin, an emitter coupled to ground, and a collector coupled to the anode of said Zener diode.

11. The integrated circuit of claim 1 wherein the secondary circuit comprises a test circuit operable to determine the operating characteristics of a component such as current, gain, potential or breakdown voltage.

12. The integrated circuit of claim 11, said component having first and second terminals, said test circuit comprising circuitry to measure the potential difference across said first and second terminals of said component in said secondary circuit.

13. The integrated circuit of claim 12 wherein said circuitry to measure comprises:
   first and second measuring pins coupled to said first and second terminals of said component; and
   first and second transistors, each of said transistors having a base coupled to a different one of said first and second terminals, each of said transistors having an emitter coupled to a different one of said first and second measuring pins such that the base-emitter voltages of said first and second transistors can be equalized by driving a predetermined current through each of said transistor and each of said transistors having a collector coupled to said enabling circuitry.

14. The integrated circuit of claim 13 wherein said first and second transistors have the same size, such that their base-emitter voltages are equal when the current through each transistor is equal.

15. A method for sharing a first pin of an integrated circuit between a primary circuit and a secondary circuit under a control of an enabling circuit forming parts of said integrated circuit, comprising the steps of:
   (a) coupling said first pin to said primary circuit by said enabling responsive to a predetermined first signal on said first pin; and
   (b) coupling said first pin to said secondary circuit by said enabling circuit responsive to a predetermined second signal different from said predetermined first signal on said first pin and disconnecting said first pin from said primary circuit.

16. The method of claim 15 and further comprising the step of disabling said primary circuit and enabling said secondary circuit responsive to a predetermined signal on a second pin.

17. The method of claim 16 wherein said disabling step comprises the step of shorting the $V_{cc}$ node of said integrated circuit to ground.

18. The method of claim 15 wherein said step of coupling the first pin to the secondary circuit comprises the step of applying a voltage to the cathode of a Zener diodes coupled between the first pin and the secondary circuit in excess of the breakdown voltage of the Zener diode.

19. The method of claim 15 wherein said secondary circuit is a test circuit including a component having at least two terminals and further comprising the step of measuring the potential between each of said two terminals of a said component.

20. The method of claim 19 wherein said measuring step comprises the steps of providing a pair of emitter follower transistors, each said emitter follower transistor having a base, a collector and an emitter and measuring the voltage between the emitters of said pair of emitter follower transistors coupling the bases of said emitter follower transistors to respective terminals of the component and coupling said collectors to said enabling circuit.

21. The method of claim 20 wherein the value of $V_{BE}$ of each said emitter follower transistor set to an equal value by conducting predetermined current through each emitter follower.

22. The method of claim 20 wherein said measuring step comprises the step of measuring the voltage difference between said pins coupled to collectors of said emitter follower transistors.

23. An apparatus for measuring the voltage between first and second terminals of a device comprising:
   (a) a controllable voltage source,
   (b) first and second current sources, each said current source operable to conduct a predetermined current; and
   (c) first and second transistors controlled by said controllable voltage source, each of said transistors having an emitter connected to one of said first and second current sources, each of said transistors having a collector coupled to said controllable voltage source and each of said transistors having a base connected to one of said first and second terminals to provide an indication of the voltage between said first and second terminals, said current sources maintaining the base-emitter voltages of each transistor equal.

24. The circuitry of claim 23 wherein said first and second transistors are of the same size.

25. The circuitry of claim 24 wherein said first and second transistors conduct equal currents.

26. A method of measuring the voltage between first and second terminals of a device comprising the steps of:
- driving a predetermined current through a first emitter follower transistor having a base coupled to a first terminal of the device;
- driving a predetermined current through a second emitter follower transistor having a base connected to the second terminal of the device, such that the base voltages of said first and second emitter follower transistors are equal; and
- measuring the potential between the emitters of said first and second transistors.

27. The method of claim 26 wherein the emitter follower transistors are of equal size such that equal predetermined currents conducted through each transistor creates equal base-emitter voltages.

* * * * *